United States Patent
Karpman et al.

(10) Patent No.: US 6,893,976 B2
(45) Date of Patent: May 17, 2005

(54) SHADOW MASK AND METHOD OF PRODUCING THE SAME

(75) Inventors: Maurice S. Karpman, Brookline, MA (US); Swaminathan Rajaraman, Pittsburgh, PA (US)

(73) Assignee: Analog Devices, Inc., Norwood, MA (US)

( * ) Notice: Subject to any disclaimer, the term of this patent is extended or adjusted under 35 U.S.C. 154(b) by 257 days.

(21) Appl. No.: 10/235,166

(22) Filed: Sep. 5, 2002

(65) Prior Publication Data

US 2004/0048484 A1 Mar. 11, 2004

(51) Int. Cl.$^7$ ............................................. H01L 21/302
(52) U.S. Cl. ...................... 438/717; 438/700; 438/706; 216/12; 216/41
(58) Field of Search ............................ 438/39, 43, 700, 438/706, 717, 719; 216/12, 17, 41, 47

(56) References Cited

U.S. PATENT DOCUMENTS 6,287,885 B1 * 9/2001 Muto et al. ................... 438/48

* cited by examiner

*Primary Examiner*—Lan Vinh
(74) *Attorney, Agent, or Firm*—Bromberg & Sunstein LLP

(57) ABSTRACT

A method of producing a shadow mask having a set of apertures (the set of apertures including a given aperture with an aperture boundary) uses a wafer having at least a first silicon layer, a second silicon layer, and an insulator layer between the first and second silicon layers. A first portion of the first silicon layer within the aperture boundary is removed. This produces a second portion of the first silicon layer, which remains within the aperture boundary. The second silicon layer within the aperture boundary is removed, as well as the insulator layer within the aperture boundary. The second portion of the first silicon layer remaining within the aperture boundary then is removed.

20 Claims, 5 Drawing Sheets

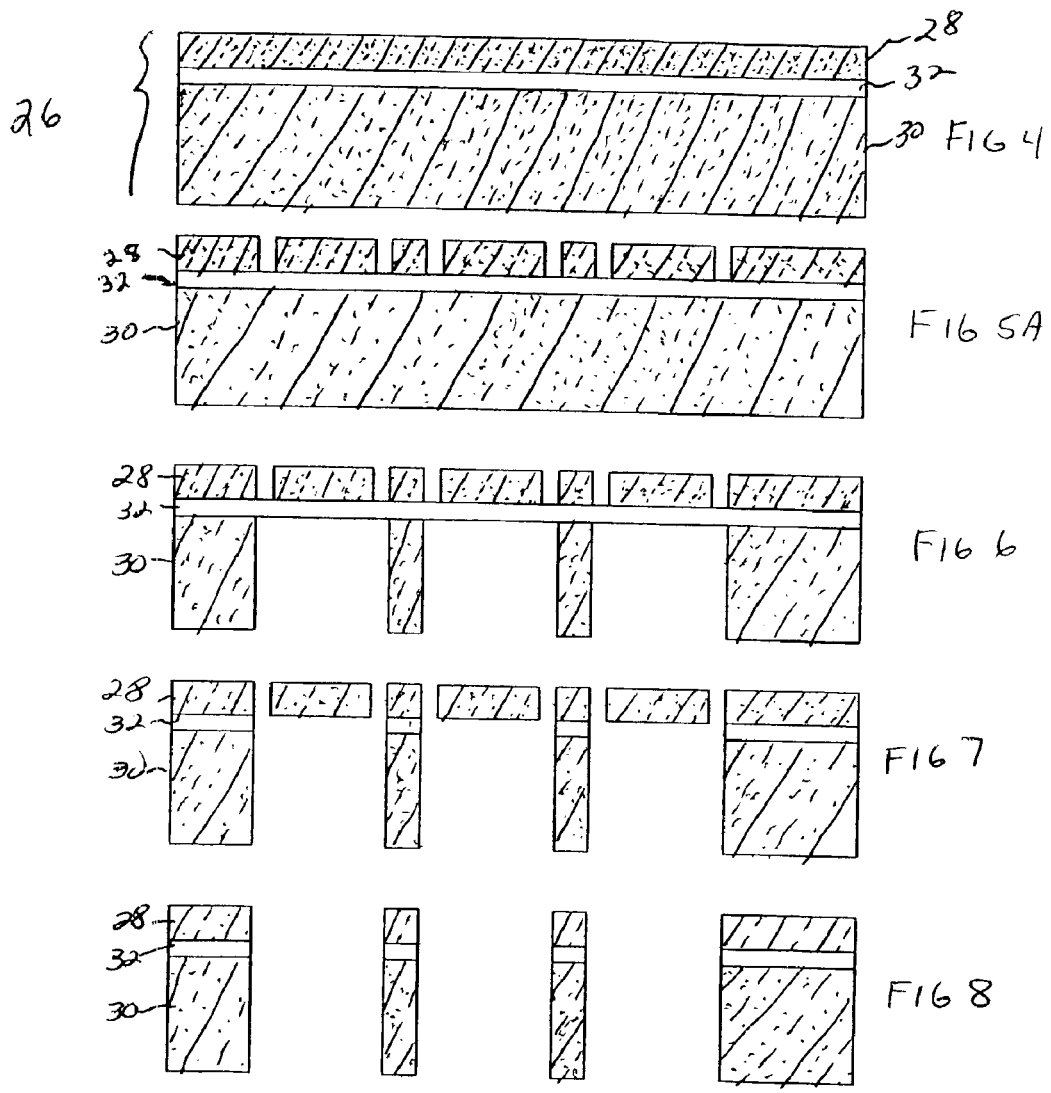

SHADOW MASK AND METHOD OF PRODUCING THE SAME

FIELD OF THE INVENTION

The invention generally relates to shadow masks and, more particularly, the invention relates to methods of producing shadow masks for optical microelectromechanical systems.

BACKGROUND OF THE INVENTION

Many types of optical microelectromechanical systems ("MEMS") have surfaces coated with reflective coatings (e.g., gold with underlayers). For example, one such type of MEMS devices is an optical switch used in telecommunications systems. In this application, a coated surface performs the function of a mirror to reflect light beams in a specified manner. To reflect light beams in the manner specified, a reflective coating must be precisely deposited onto its underlying wafer. Undesirably, it is difficult to precisely deposit coatings onto MEMS structures.

One commonly used coating deposition method, known in the art as "shadow mask deposition," applies coatings through apertures in a thin film (i.e., the film being known in the art as a "shadow mask" or "mask"). To these ends, currently available masks typically consist of a thin metal foil with a plurality of etched apertures. Such masks, however, have a number of problems. Specifically, since metal masks commonly are both flexible and not flat, it is difficult to precisely align them to a wafer. In some instances, imprecise mask/wafer alignment can cause the film to be deposited onto the wrong area of the wafer. Moreover, the coefficient of thermal expansion of metals typically used for metal shadow masks is different than that of silicon (i.e., the material of the underlying wafer). Accordingly, as the coating is deposited, the respective temperatures of the mask and wafer increase, further misaligning the mask and wafer. In some instances, the thermal expansion and contraction of the mask can alter the intended shape of the apertures, consequently distorting the intended shape of the coating on the MEMS device.

SUMMARY OF THE INVENTION

In accordance with one aspect of the invention, a method of producing a shadow mask having a set of apertures (the set of apertures including a given aperture with an aperture boundary) uses a wafer having at least a first silicon layer, a second silicon layer, and an insulator layer between the first and second silicon layers. The second silicon layer has silicon, while the insulator layer has insulator material. A first portion of the first silicon layer within the aperture boundary is removed. This produces a second portion of the first silicon layer, which remains within the aperture boundary. Silicon of the second silicon layer within the aperture boundary is removed, as well as insulation material from the insulator layer within the aperture boundary. The second portion of the first silicon layer remaining within the aperture boundary then is removed.

In some embodiments, the second portion of the first silicon layer is connected to the silicon of the first silicon layer that is not within the aperture boundary. The second portion of the first silicon layer may be removed after the second silicon layer within the aperture boundary is removed. In a similar manner, the second portion of the first silicon layer may be removed after the insulator layer within the aperture boundary is removed. The second portion of the first silicon layer may be removed by applying an adhesive backed material to the first silicon layer and removing the adhesive backed material from the first silicon layer, thereby removing the second portion of the first silicon layer.

The first silicon layer may be thinner than the second silicon layer. Moreover, the set of apertures may include at least one aperture, where the at least one aperture includes the given aperture. In addition, the first portion of the first silicon layer has a first portion area, while the second portion of the first silicon layer has a second portion area. The second portion area illustratively is larger than the first portion area.

In accordance with another aspect of the invention, a method of producing a shadow mask formed from a wafer having a first silicon layer, a second silicon layer, and an insulator layer between the first and second silicon layers (where the shadow mask has a plurality of apertures that each has having an aperture boundary) performs a plurality of acts for each aperture. In particular, a first portion of the first silicon layer within the aperture boundary is removed to leave a second portion of the first silicon layer within the aperture boundary. The second silicon layer and the insulator layer within the aperture boundary then are removed. Next, the second portion of the first silicon layer remaining within the aperture boundary is removed after at least one of the second silicon layer and the insulator layer are removed from the aperture boundary.

In illustrative embodiments, all of the above noted acts of this aspect of the invention are executed substantially simultaneously for each aperture. Moreover, for each aperture, the second portion of the first silicon layer may be connected to the silicon of the first silicon layer that is not within the aperture boundary.

BRIEF DESCRIPTION OF THE DRAWINGS

The foregoing and advantages of the invention will be appreciated more fully from the following further description thereof with reference to the accompanying drawings wherein:

FIG. 4 schematically shows a cross-sectional view of an illustrative double layer silicon on insulator (SOI) wafer before it is processed to produce a shadow mask in accordance with the process described in FIG. 3.

FIG. 5A schematically shows a cross-sectional view of the SOI wafer of FIG. 4 after respective first portions of its top silicon layer are removed.

FIG. 6 schematically shows a cross-sectional view of the SOI wafer of FIG. 4 after selected parts of its bottom layer are removed.

FIG. 7 schematically shows a cross-sectional view of the SOI wafer of FIG. 4 after selected parts of its insulator layer are removed.

FIG. 8 schematically shows a cross-sectional view of the SOI wafer of FIG. 4 after respective second portions of the top silicon layer are removed.

DESCRIPTION OF ILLUSTRATIVE EMBODIMENTS

In illustrative embodiments of the invention, a shadow mask is formed from a double layer silicon on insulator (SOI) wafer in a manner that improves mask yields during the manufacturing process. To that end, illustrative embodiments use aperture forming techniques that normally maintain the structural integrity of the insulator layer of the SOI wafer. In addition, when used to coat a silicon surface, SOI-based shadow masks constructed in illustrative embodiments generally have better tolerances than those of metal-based shadow masks. Accordingly, reflective coatings may be more precisely applied to a silicon surface (e.g., a surface in an optical microelectromechanical system). Details of illustrative embodiments are discussed below.

Figure 1:
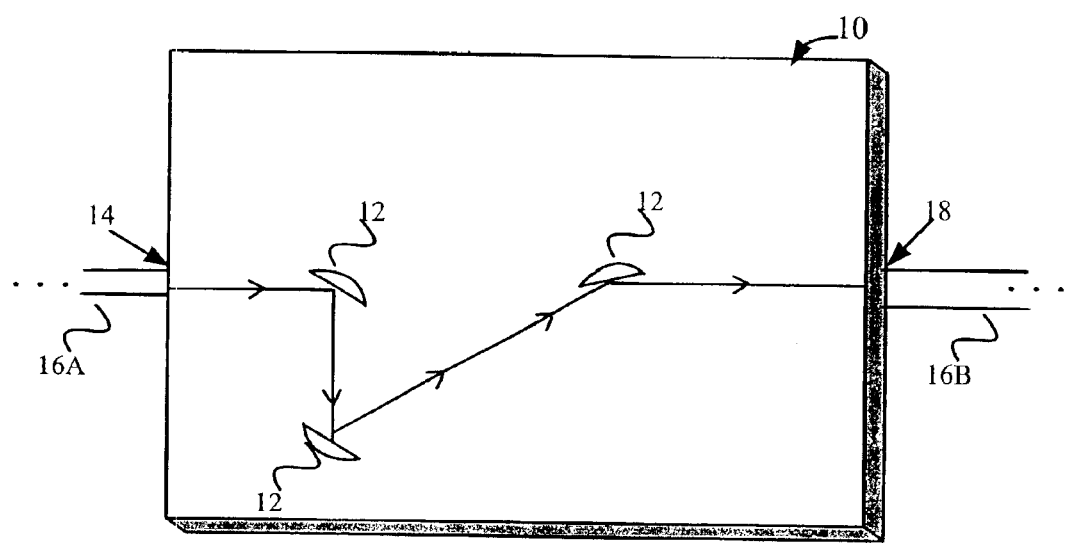
FIG. 1 schematically shows a microelectromechanical system that may implement illustrative embodiments of the invention.

As noted above, a shadow mask can be used to produce mirrors within optical microelectromechanical systems (hereinafter, "MEMS devices" or "MEMS"), such as optical switches. FIG. 1 schematically shows an exemplary optical switch 10 having mirrors 12 with reflective coatings applied through a mask produced by illustrative embodiments. The switch 10 includes an input port 14 for receiving a light beam via a fiber optic cable 16A, and an output port 18 for transmitting the light beam via another fiber optic cable 16B. Although multiple fiber optic cables may be coupled with the switch 10 via multiple ports, only single input and output ports 14 and 18 and are shown for simplicity. The switch 10 also includes three mirrors 12 (shown schematically) for reflecting the incoming light beam from the input port 14 to the output port 18. Of course, various embodiments are not limited to this configuration, or to switches in general. Other network devices or light processing devices that use a mirror may incorporate illustrative embodiments of the invention.

Figure 2:
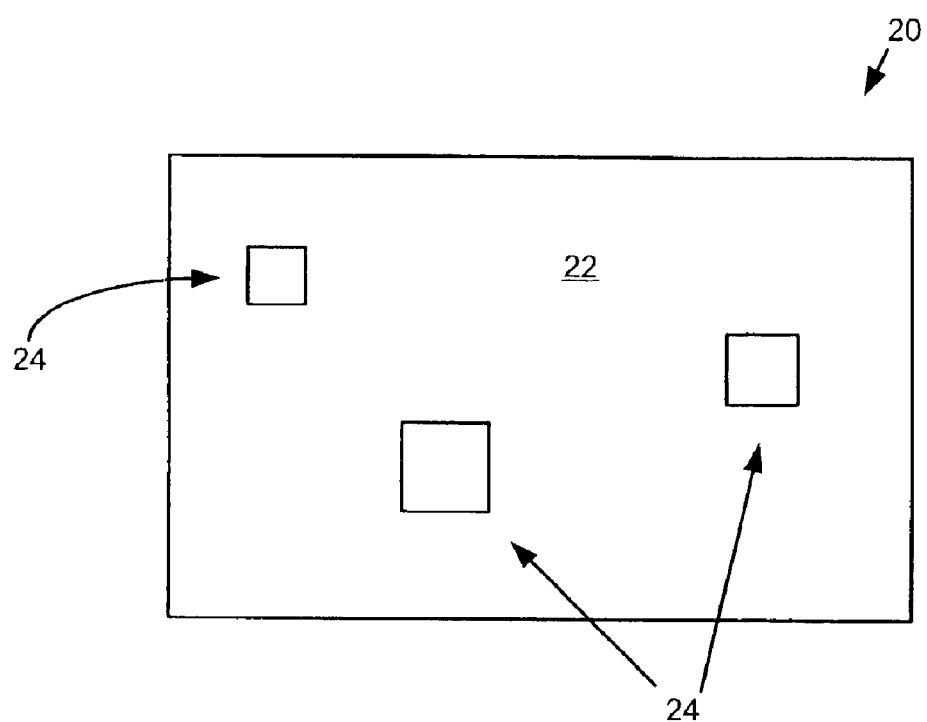
FIG. 2 schematically shows a plan view of a shadow mask that may be produced in accordance with illustrative embodiments of the invention.

The mirrors 12 shown in FIG. 1 may be formed by conventional processes that use one or more shadow masks produced by illustrative processes described herein. FIG. 2 schematically shows a plan view of one such shadow mask (hereinafter "mask 20"). The mask 20 has a flat top surface 22 (and flat bottom surface, not shown) with three through-holes (referred to herein as "apertures 24"). The apertures 24 may be any commonly used shape, such as a square shape or a rectangular shape. Various embodiments, however, are not limited to these shapes.

Prior to the coating process, the mask 20 typically is placed flush with an underlying silicon wafer and precisely located on the wafer so that the apertures 24 are at the exact location of the soon to be produced mirrors. After the mask 20 is positioned, a reflective coating material (e.g., gold) may be applied to the mask 20. As known by those skilled in the art, the mask 20 permits the coating material to be applied to the wafer at the precise locations of the apertures 24 only.

Figure 3:
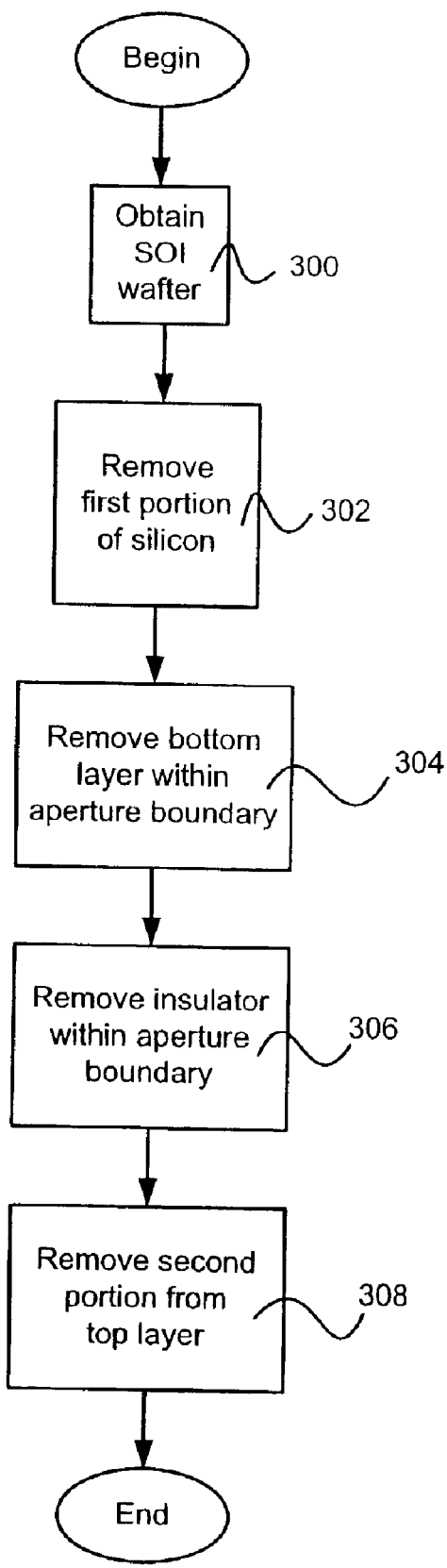
FIG. 3 shows a process of producing a shadow mask in accordance with illustrative embodiments of the invention.

FIG. 3 shows a process of producing the noted shadow mask 20 in accordance with illustrative embodiments of the invention. In addition to FIG. 3, this process is discussed with reference to FIGS. 4–9B. The process begins at step 300, in which a double layer silicon on insulator (SOI) wafer 26 is obtained. FIG. 4 schematically shows a cross-sectional view of such wafer 26. In illustrative embodiments, the wafer 26 includes a first silicon layer (referred to herein as the "top silicon layer 28"), a second silicon layer (referred to herein as the "bottom silicon layer 30"), and an insulator layer 32 between the two silicon layers. In some embodiments, the SOI wafer 26 has additional layers (not shown).

When used in a MEMS application, the bottom silicon layer 30 may be much thicker than the top silicon layer 28. For example, the bottom silicon layer 30 may be ten to twenty times thicker than the top silicon layer 28. Illustratively, the top silicon layer 28 is between about 1–30 microns, while the bottom silicon layer 30 is between about 300–600 microns.

The insulator layer 32 may be any insulator commonly used in conventional double layer SOI wafers. In illustrative embodiments, the insulator is an oxide, such as silicon oxide. Moreover, the insulator layer 32 may be much thinner than either of the two silicon layers. For example, the insulator layer 32 may have a thickness of between 0.5–2.0 microns when used with top and bottom silicon layers 28 and 30 having the dimensions noted above.

Regardless of the relative thicknesses of the different layers, the overall thickness of the SOI wafer 26 should be large enough to ensure that the resulting mask 20 has sufficient structural integrity to effectively function as a mask. Accordingly, since illustrative embodiments have relatively thin top and insulator layers 28 and 32, the thickness of the bottom silicon layer 30 may be calculated primarily based upon the relative thicknesses of such other layers 28 and 32.

In alternative embodiments, the top silicon layer 28 is thicker than the bottom silicon layer 30. In yet other embodiments, the top and bottom silicon layers 28 and 30 have the same thickness. In any event, when ultimately used to coat a wafer, either side of the mask 20 may be positioned flush against such wafer.

Figure 5B:
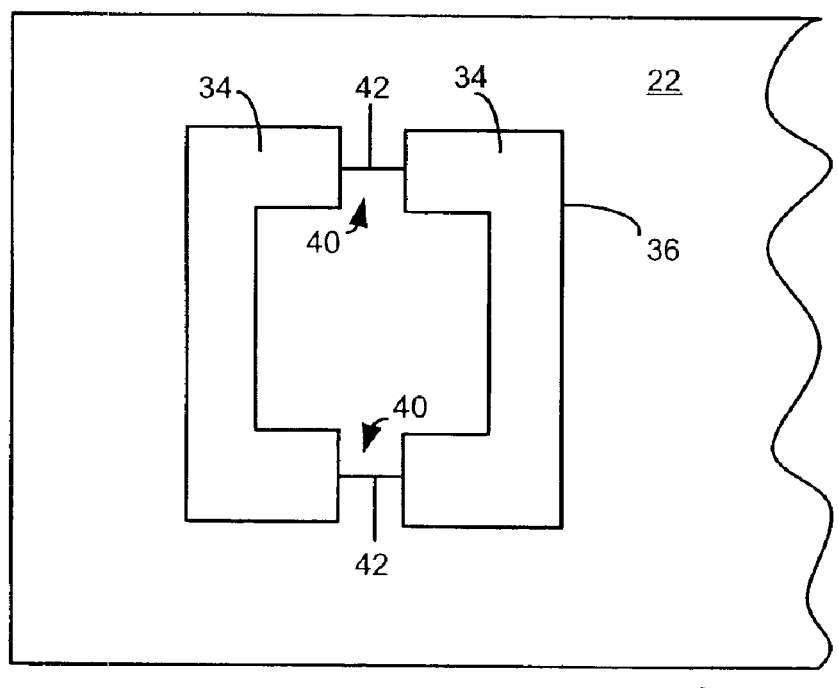
FIG. 5B schematically shows a plan view of a portion of the wafer shown in FIG. 5A.

After the SOI wafer 26 is obtained by step 300 of FIG. 3, the process continues to step 302, in which a first portion 34 of silicon is removed from the top silicon layer 28 within the boundary of each aperture 24. The outline of this first portion 34 (after it is removed) is shown in FIG. 5B on the top silicon layer 28. In other words, FIG. 5B shows the space produced after the first portion 34 is removed from the top silicon layer 28.

Figures 9A, 9B:
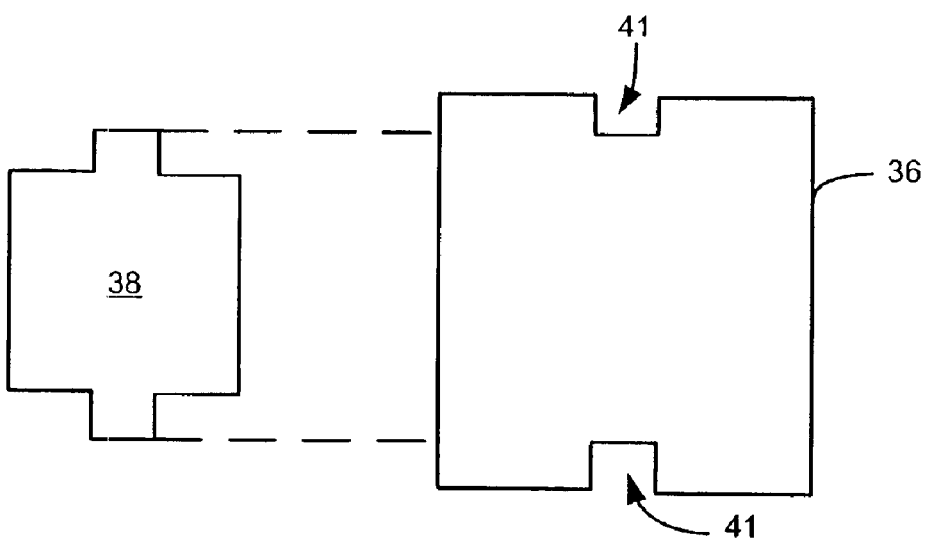
FIG. 9A schematically shows an exemplary second portion of the top silicon layer of the SOI wafer of FIG. 4 after such second portion is removed.
FIG. 9B schematically shows the shape of an exemplary aperture after the second portion of FIG. 9A is removed.

More specifically, each aperture 24 to be formed is considered to have a boundary 36 extending through the SOI wafer 26 from the top silicon layer 28 through the bottom silicon layer 30. This boundary 36 is best shown in FIG. 5A and FIG. 9B. Ultimately, the illustrative process described herein removes all insulator and silicon material that is within this boundary 36 (of each aperture 24). Step 302 thus is the initial step in this process.

Accordingly, at the above noted step 302 and as shown in FIG. 5B, most of the boundary 36 of each aperture 24 is formed by removing the first portion 34 of the top silicon layer 28 for each aperture 24. This leaves a second portion 38 of the top silicon layer 28 within the boundary 36 of each aperture 24, thus supporting the underlying insulator layer 32. When in this state, the second portion 38 still is integral with and thus, connected to, the remainder of the top silicon layer 28 by a pair of opposing tethers 40 formed when the first portion 34 is removed. Accordingly, the tethers 40 merely are a part of the silicon in the top silicon layer 28. As discussed below, a part of each tether 40 also is removed (at a break point) to completely form the aperture boundary 36. This break point is schematically shown in FIG. 5B at lines identified by reference number 42.

In exemplary embodiments having the dimensions given above, each tether 40 is about two microns wide. Moreover, the surface area of the second portion 38 illustratively is much larger than that of the first portion 34. For example, the surface area of the second portion 38 may be between 5–10 times larger than that of the first portion 34. Nevertheless, it is expected that the relative sizes of such surface areas can be closer than that range. In some embodiments, the surface areas may be the same, or the surface area of the first portion 34 may be larger than that of the second portion 38. Improved results are expected, however, when the relative surface areas are at the higher end of the range given above.

In illustrative embodiments, silicon is removed by conventional photolithography techniques. Consequently, the apertures 24 are considered to be "etched" from the noted layers. Accordingly, because such etching processes are used, the side walls should be substantially smooth and vertical.

After the first portion 34 of each aperture 24 is removed, the process continues to step 304, in which the bottom silicon layer 30 is removed within the boundaries of each aperture 24. Specifically, as shown in FIG. 6, substantially all of the silicon within the boundary 36 of each aperture 24 is removed from the bottom silicon layer 30. In fact, due to the relatively irregular shape of the boundary 36 (i.e., see FIG. 9B), a small amount of silicon outside the aperture boundary 36 also may be removed.

The process then continues to step 306, in which the insulator layer 32 is removed within the boundaries 36 of each aperture 24. Specifically, as shown in FIG. 7, substantially all of the oxide within the boundary 36 of each aperture 24 is removed from the insulator layer 32. In a manner similar to the bottom silicon layer 30, a small amount of the oxide outside the aperture boundary 36 also may be removed. In illustrative embodiments, such portions are removed by conventional processes, such as with an HF dip.

The process thus continues to step 308, in which the second portion 38 of silicon within each aperture boundary 36 is removed from the top silicon layer 28 (see FIG. 8). To that end, the wafer 26 may be placed face down so that its top surface 22 is flush against a medium-tack semiconductor grade adhesive material (not shown). By way of example, the adhesive material may be such material that is distributed under the trade name GEL FILM™ (e.g., product number WF-70-X4), distributed by Gelpak, LLC of Hayward, Calif. Such adhesive material should suffice when used with a mask having the above noted dimensions because its adhesion force is greater than the fracture strength of the tethers 40.

After it is secured to the adhesive material, the adhesive material and wafer 26 are separated. In illustrative embodiments, this separation forcibly and mechanically breaks off the second portion 38 for each aperture 24, which is expected to remain lightly adhered to the adhesive material. FIG. 9A schematically shows an exemplary second portion 38 after it is broken off in this manner.

Of course, the second portion 38 does not necessarily have to be adhered to the adhesive material after it is removed. Rather, the principle function of the adhesive material is to remove the second portion 38 of each aperture 24 by creating stress at a break point (noted above and identified in FIGS. 5A and 9B by reference number 42) of each tether 40. In some embodiments, the tethers 40 are specially formed to have stress concentrators at specific locations. Consequently, when the second portion 38 is removed, the tethers 40 break at selected locations to improve consistency in the break locations. For example, the stress concentrators can be placed to eliminate the notch 41 in the aperture boundary 36.

Although noted above, it should be reiterated that in illustrative embodiments, the notches 41 are in the top silicon layer 28 only—they are not in the bottom silicon layer 30 or in the insulator layer 32. The notches 41 nevertheless may be considered to be the boundary 36 for the entire aperture 24 and not just for the top silicon layer 28. They are expected to have a negligible effect on the quality and effectiveness of the mirrors formed with such mask 20. In alternative embodiments, the other layers have corresponding notches 41. In yet other embodiments, some silicon and/or insulator material in the bottom silicon layer 30 and insulator layer 32, respectively, may remain within the aperture boundary 36.

As discussed above, various embodiments of the invention are not necessarily limited to the specifics discussed herein. For example, the insulator layer 32 may be removed by some means other than an HF dip. As a further example, some means other than an adhesive material may be used to remove the second portion 38.

In illustrative embodiments, each step in the process discussed for FIG. 3 is executed substantially simultaneously for each aperture 24 formed in a given mask. For example, if a mask has nine apertures 24, the respective first portions 34 are removed from all nine apertures 24 (step 302) before the bottom silicon layer 30 of any one aperture 24 is removed (step 304). In alternative embodiments, however, the process may be completely executed for any set of single or plural apertures 24 before beginning the process for other apertures 24.

A mask produced by the discussed process has a number of advantages. Specifically, by supporting the relatively fragile insulator layer 32 while other layers are being removed (i.e., by leaving the second portion 38 in place), manufacturing yields should be improved. In addition, using a silicon based mask should provide more precision when coating a silicon surface.

Although various exemplary embodiments of the invention are disclosed below, it should be apparent to those skilled in the art that various changes and modifications can be made that will achieve some of the advantages of the invention without departing from the true scope of the invention.

What is claimed is:

1. A method of producing a shadow mask, the shadow mask having a set of apertures, the set of apertures including a given aperture with an aperture boundary, the method comprising:

providing a wafer having at least a first silicon layer, a second silicon layer, and an insulator layer between the first and second silicon layers, the second silicon layer comprising silicon, the insulator layer comprising insulator material;

removing a first portion of the first silicon layer within the aperture boundary, a second portion of the first silicon layer remaining within the aperture boundary;

removing silicon from the second silicon layer within the aperture boundary to form the aperture in the second silicon layer;

removing insulator material from the insulator layer within the aperture boundary to form the aperture in the insulator layer; and removing the second portion of the first silicon layer remaining within the aperture boundary to complete the aperture in the first silicon layer, the second portion supporting the insulator layer within the aperture boundary during removal of at least one of the second silicon layer and the insulator layer.

2. The method as defined by claim 1 wherein the second portion of the first silicon layer is connected to the silicon of the first silicon layer that is not within the aperture boundary.

3. The method as defined by claim 1 wherein the second portion of the first silicon layer is removed after the second silicon layer within the aperture boundary is removed.

4. The method as defined by claim 1 wherein the second portion of the first silicon layer is removed after the insulator layer within the aperture boundary is removed.

5. The method as defined by claim 1 wherein removing the second portion of the first silicon layer comprises applying an adhesive backed material to the first silicon layer and removing the adhesive backed material from the first silicon layer, thereby removing the second portion of the first silicon layer.

6. The method as defined by claim 1 wherein the first silicon layer is thinner than the second silicon layer.

7. The method as defined by claim 1 wherein the set of apertures includes a plurality of apertures, the plurality of apertures including the given aperture.

8. The method as defined by claim 1 wherein the first portion of the first silicon layer has a first portion area, the second portion of the first silicon layer having a second portion area, second portion area being larger than the first portion area.

9. A method of producing a shadow mask formed from a wafer having a first silicon layer, a second silicon layer, and an insulator layer between the first and second silicon layers, the shadow mask having a set of apertures, the set of apertures including a given aperture with an aperture boundary, the method comprising:

removing a first portion of the first silicon layer within the aperture boundary, a second portion of the first silicon layer remaining within the aperture boundary;

removing both the second silicon layer within the aperture boundary and the insulator layer within the aperture boundary to form the aperture in the second silicon layer and the insulator layer; and removing the second portion of the first silicon layer remaining within the aperture boundary after at least one of the second silicon layer and the insulator layer are removed from the aperture boundary to complete the aperture in the first silicon layer, the second portion supporting the insulator layer within the aperture boundary during removal of at least one of the second silicon layer and the insulator layer.

10. The method as defined by claim 9 wherein the second portion of the first silicon layer is connected to the silicon of the first silicon layer that is not within the aperture boundary.

11. The method as defined by claim 9 wherein removing the second portion of the first silicon layer comprises applying an adhesive backed material to the first silicon layer and removing the adhesive backed material from the first silicon layer, thereby removing the second portion of the first silicon layer.

12. The method as defined by claim 9 wherein the first silicon layer is thinner than the second silicon layer.

13. The method as defined by claim 9 wherein the set of apertures includes at least one aperture, the at least one aperture including the given aperture.

14. The method as defined by claim 9 wherein the first portion of the first silicon layer has a first portion area, the second portion of the first silicon layer having a second portion area, second portion area being larger than the first portion area.

15. A shadow mask produced by the process of claim 9.

16. A method of producing a shadow mask formed from a wafer having a first silicon layer, a second silicon layer, and an insulator layer between the first and second silicon layers, the shadow mask having a plurality of apertures, each aperture having an aperture boundary, the method comprising for each aperture:

A. removing a first portion of the first silicon layer within the aperture boundary, a second portion of the first silicon layer remaining within the aperture boundary;

B. removing both the second silicon layer within the aperture boundary and the insulator layer within the aperture boundary to form the aperture in the second silicon layer and the insulator layer; and C. removing the second portion of the first silicon layer remaining within the aperture boundary after at least one of the second silicon layer and the insulator layer are removed from the aperture boundary to complete the aperture in the first silicon layer, the second portion supporting the insulator layer within the aperture boundary during removal of at least one of the second silicon layer and the insulator layer.

17. The method as defined by claim 16 wherein each one of A–C are executed substantially simultaneously for each aperture.

18. The method as defined by claim 16 wherein for each aperture, the second portion of the first silicon layer is connected to the silicon of the first silicon layer that is not within the aperture boundary.

19. The method as defined by claim 16 further including applying an adhesive backed material to the first silicon layer and removing the adhesive backed material from the first silicon layer, thereby removing the second portion of the first silicon layer for each aperture.

20. The method as defined by claim 16 wherein the first silicon layer is thinner than the second silicon layer.

* * * * *